United States Patent [19]

Weinert

[11] 4,103,223

[45] Jul. 25, 1978

[54] CLOSED LOOP FOR AUTOMATIC SUBSTITUTION OF A SIGNAL OF EQUAL AMPLITUDE

[75] Inventor: Fritz K. Weinert, Gaithersburg, Md.

[73] Assignee: Weinschel Engineering Company, Gaithersburg, Md.

[21] Appl. No.: 808,742

[22] Filed: Jun. 21, 1977

[51] Int. Cl.² .............................................. G01R 27/00
[52] U.S. Cl. .................................. 324/57 R; 324/100; 328/168
[58] Field of Search ............... 324/57 R, 57 SS, 57 H, 324/99 D, 100; 328/59, 168

[56] References Cited

U.S. PATENT DOCUMENTS

| | | | |
|---|---|---|---|
| 3,104,354 | 9/1963 | Weinschel et al. | 324/57 R X |
| 3,243,699 | 3/1966 | Kummer | 324/57 R |
| 3,600,675 | 8/1971 | Grenier | 324/57 R |

*Primary Examiner*—Stanley T. Krawczewicz
*Attorney, Agent, or Firm*—William D. Hall; Geoffrey R. Myers

[57] ABSTRACT

A device for testing the accuracy of an attenuator, over a range of frequencies from 1 to 18 GHz, for example, and having a first variable frequency signal generator which passes its output through the attenuator. The resulting output signal, and a local oscillator/mixer combination produce an IF signal (Hereinafter, "first signal"). A second signal source, at the IF frequency, passes its output through a variable attenuator and a step attenuator to produce a "second signal". The "first" and "second" signals are fed to a closed loop which includes an integrator that controls the variable attenuator to tend to keep the first and second signals at the same amplitude. A branch circuit, controls a second step attenuator; and includes means to produce an output level the value of which represents the value of signal level of the "first signal". The bandwidth of the closed loop is automatically narrowed when the amplitude of said first signal is low to give an optimum signal to noise ratio, under all conditions. Using the foregoing apparatus, the absolute attenuation of the attenuator under test is determined by making measurements with the attenuator inserted and not inserted.

26 Claims, 7 Drawing Figures

CLOSED LOOP FOR AUTOMATIC SUBSTITUTION OF A SIGNAL OF EQUAL AMPLITUDE

BACKGROUND OF THE INVENTION

In its broader aspects, the invention is not limited to a complete system such as was described in the foregoing Abstract, but to a device for substitution of signals. Devices for comparing the amplitudes of two signals are well known but they are plagued with the problem that the device must work over a wide range of signal amplitudes. At low amplitudes the signal-to-noise ratio is unacceptable unless the bandwidth is narrow. A narrow bandwidth increases the time required for the device to settle to a stable output indication. This slows the test process especially if tests are to be made at least about 200 selected frequencies between, for example, 1 GHz and 18 GHz.

The primary object of this invention is to overcome the aforesaid disadvantage.

Other objects and advantages of this invention will appear as this description proceeds, especially advantages relating to improving the automation, speed and accuracy of a device of the class described.

SUMMARY OF THE INVENTION

The signal to be substituted is compared with an internally generated "second signal" in a closed loop at the input of an IF-amplifier. The "second" signal passes through a variable attenuator whose attenuation is varied by the output of the integrator to equalize the amplitudes of the two input signals. Changes exceeding the attenuation range of the variable attenuator result in the stepping of a step attenuator also in the closed loop.

The changes in attenuation in the closed loop solve the bandwidth problem. At low signal amplitudes the bandwidth of the closed loop is automatically narrowed by the higher open loop attenuation and is designed to give an acceptable signal-to-noise ratio. When the signals have high amplitude the open loop attenuation in the closed loop is inherently lower thus giving a faster response time enabling the closed loop to settle to its equilibrium condition quickly so that a fast reading (or recording) of the results of the measurement may be made and the apparatus advanced to the next test of the series.

An improvement upon the foregoing basic principle involves a branch which is not a part of the closed loop and which determines accurately the level of the "second" signal at the output of the variable attenuator, and which consists of a step attenuator, having small steps, a linear detector, a shaping circuit and a meter circuit, such as an analog-to-digital converter. The attenuator in said branch varies between given limits, and when said limits are exceeded in either direction, the said step attenautor in the closed loop is stepped. The branch thus responds to small changes in attenuation and does not affect the equilibrium of the closed loop each time the apparatus responds to a small change in attenuation of the device under test, and, therefore, less time is lost during a series of measurements due to delays in the closed loop settling to its final value.

A further improvement involves an adder which combines the dB values of the attenuation of the step attenuator in the closed loop with the attenuation of the step attenuator in said branch and with the meter circuit output and with error corrections stored in a read-only-memory, which are provided for each of the steps of both step attenuators, to indicate the desired attenuation meausrements at the digital readout.

A further improvement involves determining when the value of the digital readout has settled to a stable condition, which is the measurement value, so that the latter may be stored, recorded, printed, or indicated and the apparatus advanced for the next test measurement. This may be done visually since a visual measuring instrument may be provided, or it may be done automatically with a programmable calculator or computer which responds to variations in the output of the digital readout and determines when the apparatus has settled to the final measurement value. When the apparatus has settled to the final measurement value, the output of the digital readout is stored or recorded for a subsequent print-out, or curve plotting operation, and the programmable calculator or computer then instructs the apparatus to advance to the next test which it is programmed to undertake.

DETAILED DESCRIPTION OF THE INVENTION

Figure 1:
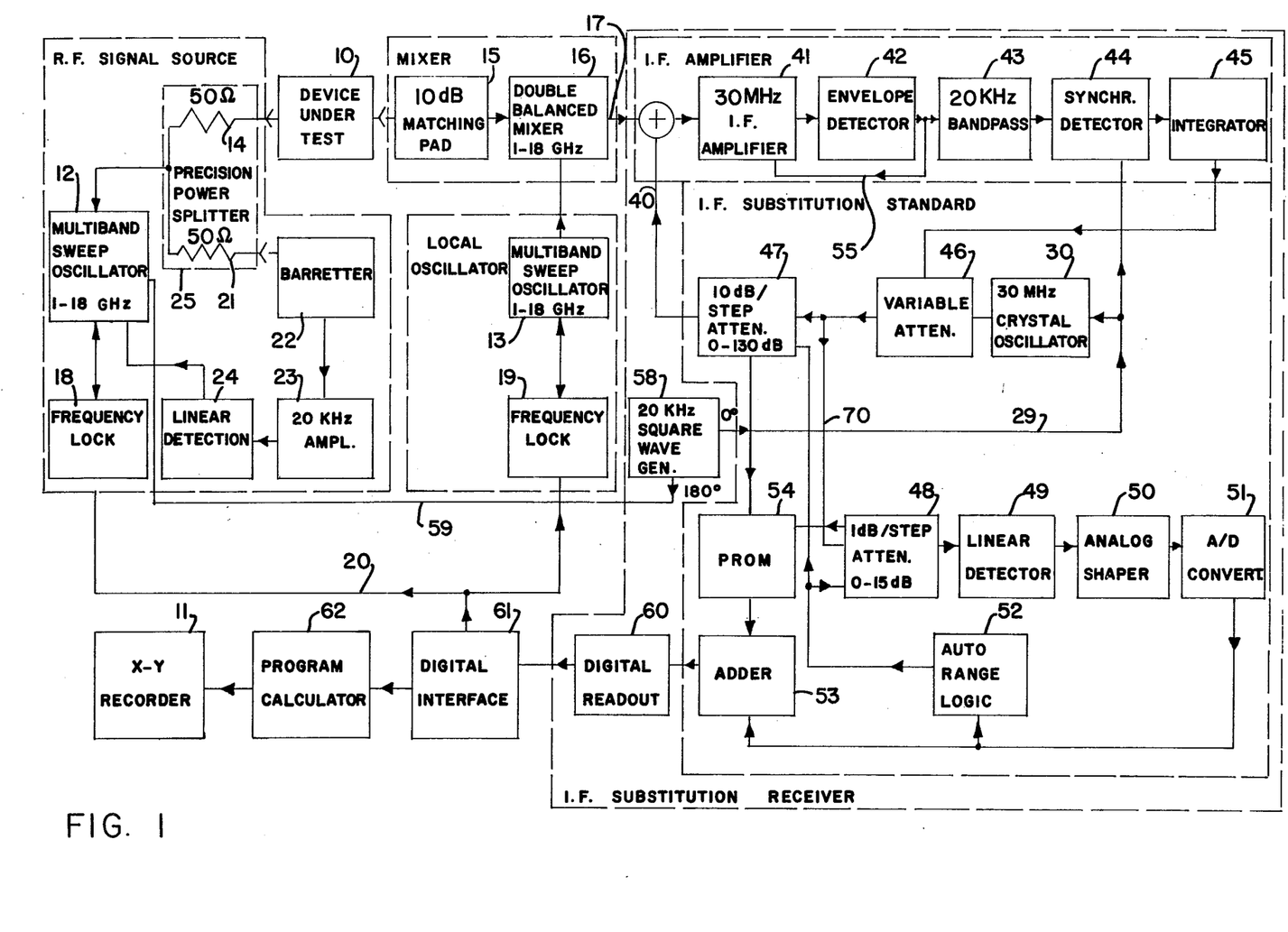
FIG. 1 is a block diagram of the complete test apparatus.

The purpose of the apparatus shown in FIG. 1 is to determine the dB value of a "Device Under Test" 10, which in this case is a precision attenuator, throughout a range of frequencies from 1 to 18 GHz, and/or to record the results on the X-Y Recorder 11.

In carrying out the foregoing object, there are provided two multiband sweep oscillators 12 and 13 which always have frequencies exactly 30 MHz apart. The oscillators 12 and 13 are respectively controlled by frequency locks 18 and 19 which vary the frequencies of oscillators 12 and 13 in steps from approximately 1 to 18 GHz, but at all times the two oscillators differ in frequency by 30 MHz as stated above. The output of oscillator 12 passes through resistor 14 of a precision power splitter 25, through the "Device Under Test" 10, through the 10 dB matching pad 15, to the double balanced mixer 16. The mixer 16 also receives a local oscillator signal from oscillator 13 and, therefore, has an output of 30 MHz on port 17.

The two identical multiband sweep generators 12 and 13 are used as signal source and local oscillator, respectively, and are operated in the fixed (nonswept) frequency mode. The frequency is set by a digital BCD input signal. Crystal frequency accuracy and long-term stability is obtained by employment of a digital frequency loop containing an automatic microwave frequency counter in its feedback path. Suitable apparatus for accomplishing this purpose is old and well known and is on sale by the assignee of the present application and comprises Weinschel Model 4311A. Within the frequency range of 1-18 GHz, frequency setting resoluton is 1 kHz and a frequency change is accomplished, on the average, in 100 ms. The only conductive coherent leakage path between the signal source and the mixer input — other than power lines — is through the digital frequency control lines 20, which are filtered, thereby increasing the attenuation of this leakage path to cover 160 dB, thus allowing the attenuation measurement over a dynamic range in excess of 120 dB.

While oscillators 12 and 13 are selected from well known types of sweep oscillators, these oscillators do not in fact sweep over the frequency range. Instead, they change their frequencies in discrete steps as desired. Their frequencies could, of course, be shifted manually if the oscillators employed appropriate controls an operating panels. However, to achieve automatic control of the frequency, the desired changes in frequency are stored in programmable calculator 62, which feeds instructions as to frequency changes through digital interface 61 to frequency locks 18 and 19 which in turn control the frequencies of oscillators 12 and 13.

The source and load impedance mismatches at the insertion point are kept small over the whole frequency range in order to achieve low mismatch uncertainty errors without the need for tuning. This is achieved by use of a precision 50-$\omega$/50-$\omega$ power splitter 25 in a high gain leveling loop for the source impedance and by use of a good 10-dB broad-band attenuator 15 preceding the high-level double-balanced mixer 16. The source and load VSWR's are less than 1.10 over the 1- to 18-GHz band, giving a worst case mismatch uncertainty of less than $\pm 0.06$ dB. For more information on the aspects of the power splitter 25 described in this paragraph, see Hewlett-Packard, "Measurement of complex impedance 1-1000 MHz," Application Note 77-3, pp. 9-10, 1 Apr. 1967; D. Woods, "Improvements in or relating to apparatus for the measurement of reflection coefficient and the complex parameter of multiport electrical networks at ratio frequency"; and Patent Specification 1,333,897, Feb. 10, 1962, Great Britain.

By feeding part of the output of oscillator 12 through resistor 21 of the power splitter 25, to the barretter 22, then to the 20 kHz amplifier 23, then to the linear detector 24 and back to the oscillator 12, stabilization of the source signal level is obtained by the high-gain leveling loop 12-21-22-23-24-12 using a barretter 22 as the detector to minimize influences of harmonics, as explained in the article F. K. Weinert, B. O. Weinschel, and D. D. Woodruff, "Barretter and diode comparison for insertion-loss measurements in the presence of harmonics," *Microwave J.*, pp. 39-43, Mar. 1975.

A 30 MHz crystal oscillator 30 feeds a signal through variable attenuator 46, which has an attenuation range of about 20 dB range thence through 10 dB step attenuator 47, which may vary its attenuation from 0-130 dB in 10 dB steps, to the line 40.

The signals on lines 17 and 40 always occur at different times, since the 20 kHz square wave generator 58 energizes oscillator 30 during one-half of its cycle via wire 29 and energizes oscillator 12 during the other half of its cycle, via line 59.

A signal on either lines 17 or 40 enters 30 MHz I.F. amplifier 41, whose output is fed to envelope detector 42. The output of the envelope detector 42 is fed back by automatic gain control (AGC) line 55 to amplifier 41 to maintain a signal of constant amplitude. The output of envelope detector 42 is a square wave pulsating direct current, with the amplitude of the pulsations proportional to the amplitude difference between the signals on lines 17 and 40. The 20 kHz bandpass filter 43 removes the d.c. component from the pulsating d.c. output of envelope detector 42 as well as rounds off the square corners of the wave so that the shape of the wave now approaches a sine wave. Moreover, since the d.c. component has been removed, this wave is now alternating current at a frequency of 20 kHz. The output of filter 43 is fed to synchronous detector 44, which is energized via line 29 of the 20 kHz square wave generator 58. The synchronous detector 44 converts its input into a pulsating d.c. output which is positive when the 30 MHz signal on line 17 has greater amplitude than the 30 MHz signal on line 40, and negative when the amplitude of the signal on line 40 exceeds that on line 17. The output of synchronous detector 44 is fed to integrator 45 which integrates the area under the curve representing the pulsating d.c. voltage output of synchronous detector 44 and adjusts the variable attenuator 46 to increase its attenuation (up to a maximum change of 20 dB) if the level of the signal fed to integrator 45 continues to be of one polarity and decreases its attenuation (to a minimum of zero) if the level of the signal fed to the integrator 45 continues to be of the other polarity. The attenuation of the variable attenuator 46 will depend on the output of the intergrator 45 which at any given instant is the integration of the positive and negative signals fed to it. The purpose of integrator 45 is to adjust the variable attenuator 46 as required to adjust the amplitude of signal on line 40 until it is equal to the amplitude of signal on line 17 and to provide for the desired variable closed loop bandwidth of the apparatus.

As the variable attenuator 46 varies within its range of 20 dB, the level on line 70 varies accordingly and the step attenuator 48 is controlled. This step attenuator 48 has a range from 0 to 15 dB and varies in 1 dB steps. Depending upon the level on line 70, the attenuator 48 will be set to one of its 15 different steps (attenuation values) so that its output level falls within a 1 dB window.

The level on line 70 will rarely correspond exactly to a dB value representing one of the steps of the attenuator 48. That is to say, generally, the level on line 70 will not call for exactly 4 dB, or 6 dB, or one of the other of the 15 steps but will be a figure such as 4.321 dB.

The signal on line 70 after its attenuation by step attenuator 48 is fed to linear detector 49. The signal strength reaching detector 49 depends, of course, on which one of its sixteen settings the step attenuator has been selected at the time in question. The linear detector 49 produces a d.c. output the amplitude of which is related to the fraction of 1 dB that exceeds the dB setting of the step attenuator 48. The analog shaper 50 reshapes and feeds the signal to the A/D converter 51. This A/D converter 51 responds to its input to ascertain in steps of 0.001 dB (up to a maximum of 1 dB) the amount of attenuation (over and above the setting of attenuator 48) called for by the level on line 70. The A/D converter 51 then produces a digital output signal, addressed to automatic range logic unit 52 and adder 53, representing the fraction of 1 dB which is represented by the signal fed to A/D converter 51.

The automatic range logic 52 has a memory which remembers that dB settings of 10 dB/step attenuator 47, the 1 dB/step attenuator 48 and the dB value in A/D converter 51. Therefore, when automatic range logic 52 finds that A/D converter 51 has increased its dB to its maximum of 1 dB, it automatically decreases the dB value of step attenuator 48 by one dB (one step). Similarly, if the A/D converter 51, in response to the signal fed to it, goes to the zero dB end of its range, the automatic range logic 52 increases the step attenuator 48 by one dB (one step).

If the repeated operations of the foregoing apparatus attempts to carry the step attenuator 48 beyond its upper limit of 15 dB, the automatic range logic 52 sets step attenuator 47 lower by one step (which is 10 dB) following which step attenuator 48 and A/D converter 51 readjust their settings to give the correct overall attenuation. Similarly, if automatic range logic 52 in response to repeated changes in A/D converter 51 attempts to reduce step attenuator 48 to below zero, the automatic range logic 52 then increases step attenuator 47 by one step, and the step attenuator 48 and A/D converter 51 adjust to the new conditions.

As an example of the foregoing, assume that the 10 dB step attenuator 47 is on its fifth step representing a dB value of 4 dB (remembering that the first step is zero dB), and the A/D converter 51 has a dB value of 0.500. Next assume that the dB value of the device under test 10 increases by 8 dB. The level at port 17 will fall by 8 dB, AGC 55 will increase the gain of amplifier 41 by 8 dB (assuming that the amplitude of the signal is so high that AGC 55 controls the gain of amplifier 41), and integrator 45 will increase the attenuation of variable attenuator 46 to attempt to lower the level at line 40. The level on line 70 will then fall and the dB value of step attenuator 48 must decrease. The dB value of the A/D converter will thereupon immediately go to above 1 dB where auto range logic 52, which senses the out-of-range condition of converter 51, will decrease the dB value of step attenuator 48. The latter will then go in five steps to zero and when it reaches that point, auto range logic 52, which is continuously aware of the dB settings of step attenuator 48 and A/D converter 51, will increase the attenuation of step attenuator 47 by one 10 dB step. This will lower the level on line 40 causing integrator 45 to decrease the attenuation of variable attenuator 46 which in turn will cause A/D converter 51 to go to the bottom ($< 0$ dB) of its range which causes the step attenuator 48 to step upward six times to a value of 6 dB at which point the dB value of A/D converter 51 will increase to 0.500 dB, as the overall device is settling to stable conditions.

The step attenuator 47 may not be absolutely accurate at all 13 of its steps. Any error for any one of its steps is stored in programmable read only memory 54. Similarly, the step attenuator 48 may not be absolutely accurate at all fifteen of its steps, and each error at each step is stored in programmable read only memory 54.

At any given instant, adder 53 adds the following (a) the dB values in step attenuators 47, (b) the fifteens complement of the dB value of step attenuator 48, (c) the applicable corrections for those attenuators in programmable read only memory 54, and (d) the dB value readout of A/D converter 51. The resulting summation represents the signal level 17 in dB to a resolution to 0.001 dB and constitutes the output of adder 53 and is fed to digital readout 60. In addition it is fed through digital interface 61 to programmable calculator 62, where it is stored. Finally, when all information is available, including the frequency changes that have taken place in oscillators 12 and 13, the programmable calculator 62 instructs the X-Y recorder 11 to plot the results which, of course, show the dB values for "device under test" 10 in relation to frequency over the range from 1 to 18 GHz. Alternatively, the results are printed out in a list at the calculator 62.

Whenever the step attenuator 47 shifts a step, it creates a disturbance in the closed loop 40, 41, 42, 43, 44, 45, 46 and 47, and inaccuracies will result unless a time interval elapses; in which the loop can settle to its final equilibrium, after such a shift in step attenuator 47 has occurred, before measurements are recorded. Therefore, Auto Range Logic 52, every time that the step attenuator 47 shifts by one step thereupon, delays any further measurements for a predetermined time interval which is selected, during the design of the apparatus, to be adequate to allow the aforesaid closed loop 40–47 to settle.

One of the advantages of the present invention is that step attenuator 48 and A/D converter 51 are outside the closed loop 40–47 and changes in their attenuations do not create disturbances as described above in connection with step attenuator 47. Furthermore, by placing step attenuator 48 outside the loop, the linear detector 49 may also be outside the loop. If the linear detector 49 were in the loop it would require an amplitude range of at least 16 dB; whereas if it is outside the loop (as shown), it requires an amplitude range of only about 1 dB which is an advantage.

The most important item of novelty in connection with this application pertains to the change in bandwidth of the closed loop 40–47 in accordance with changes in other factors as will soon appear. This is desirable since when the signal strength on line 17 is low, the thermal noise in the circuit causes an undesirable low signal-to-noise ratio. This signal-to-noise ratio is improved if the bandwidth of the closed loop 40–47 is narrowed.

Figure 2:
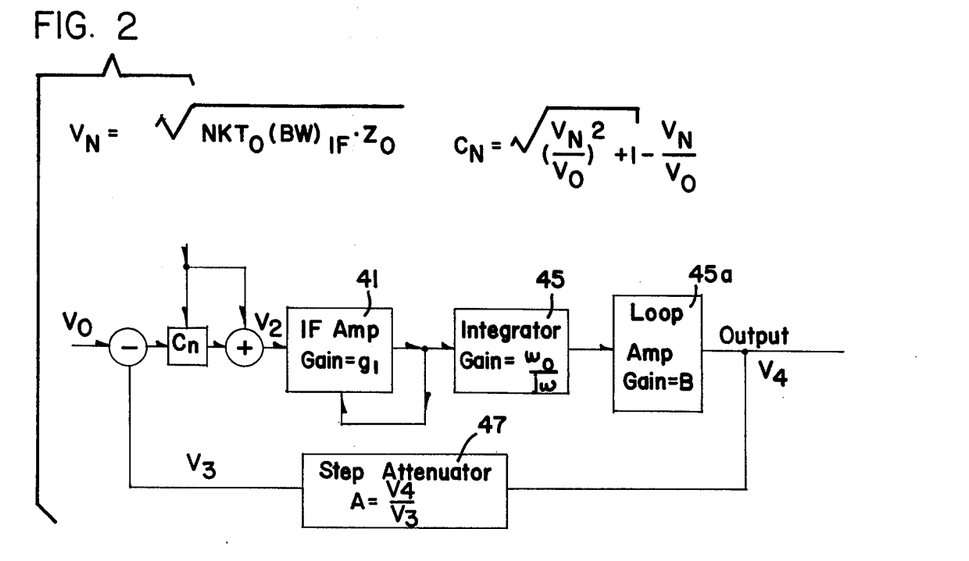
FIG. 2 is a simplified block diagram of the closed loop for purposes of mathematical explanation.

For the purpose of simplifying the analysis of the closed loop 40–47, I have disclosed, in FIG. 2, the three important elements IF amplifier 41, integrator 45 and step attenuator 47. Loop amplifier 45a may be added, or similar amplification may be achieved elsewhere.

The parallel IF substitution is self-balancing using the loop shown in FIG. 2. The closed loop performance between the readout voltage $V_4$ and the input signal voltage $V_0$ depends on the gain $g_1$ of the AGC IF amplifier, the voltage division $A$ of the step attenuator, the integrator gain $\omega_0/j\omega$ and an amplifier with gain $C_n$, controlled by the signal-to-noise ratio at the IF envelope detector input. The latter effect is due to the behavior of envelope detectors by which the weaker of two noncoherent signals is attenuated by the stronger one. With the definitions given in FIG. 2 we obtain for the readout voltage $$V_4 = \frac{AV_0 + AV_n \frac{1}{C_n}}{1 + j\frac{\omega}{\omega_0} \cdot \frac{A}{g_1 B C_n}} \quad (1)$$

where $A$ is the precisely known voltage division of the 10-dB-per-step attenuator and $$C_n = \sqrt{\left(\frac{V_n}{V_0}\right)^2 + 1} - \frac{V_n}{V_0}. \quad (2)$$

The readout steady state signal $V_4$ is composed, as shown in (2), of the true signal voltage $AV_o$ and the noise voltage $AV_N/C_n$. The dynamic response of the loop is that of a single-pole filter and can be characterized by its time constant $$T = \frac{A}{\omega_0 g_1 B C_n}. \qquad (3)$$

As indicated above, one factor bearing on the signal to noise ratio relates to the automatic gain control (AGC) 55 controlling IF amplifier 41. If the signal is of low amplitude, the AGC 55 does not reduce the gain of IF amplifier 41 and hence that amplifier 41 has its maximum gain. When the amplitude of the signal on line 17 is strong enough the AGC 55 will reduce the gain of the IF amplifier 41 to keep the amplitude of the signal at the output of envelope detector 42 constant. As will appear the gain of the IF amplifier 41 has an effect on the bandwidth of the closed loop 40–47.

Another factor that bears on the bandwidth of closed loop 40–47 is the value of the attenuation of step attenuator 47. Since this step attenuator is directly in series with the closed loop 40–47, when its dB value increases the open loop gain decreases and tends to decrease the closed loop bandwith.

Figure 5:
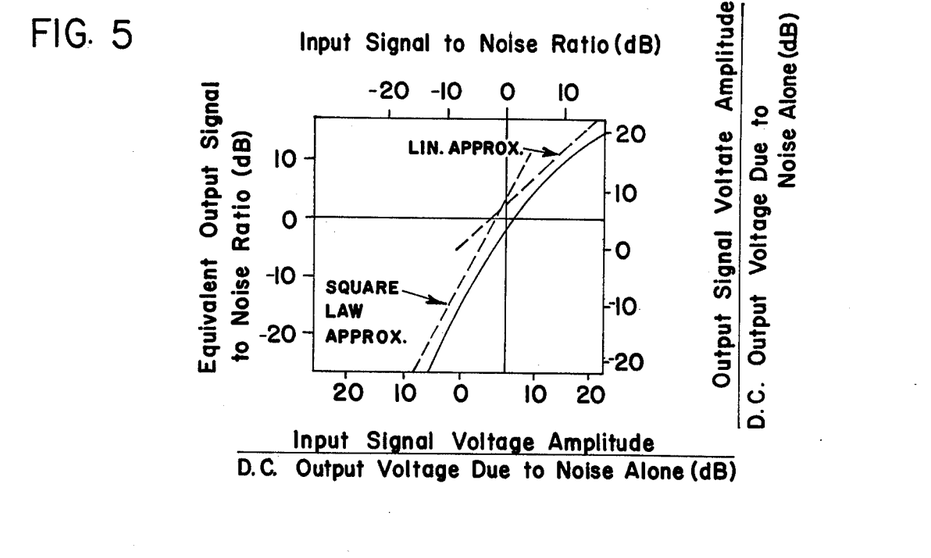
FIG. 5 is a curve that shows the characteristics of the envelope detector that is located in the closed loop.

The envelope detector 42 also has adverse effect on the signal to noise ratio which is compensated for by the two factors mentioned in the two immediately preceding paragraphs. An envelope detector such as 41 characteristically has an output varying linearly with its input down to about a signal level, at which the input signal level equals the noise input level. For lower level input signal levels the signal output amplitude varies with the square of its input signal amplitude. FIG. 5 shows the foregoing relationship in more detail. The foregoing characteristic of the envelope detector 42 results in a change in bandwidth tending to overcome said adverse effect, as will appear.

Figure 3:
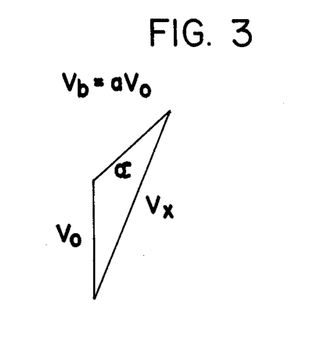
FIG. 3 is a vector diagram used in explaining the operation of a linear detector with two signals.
Figure 4:
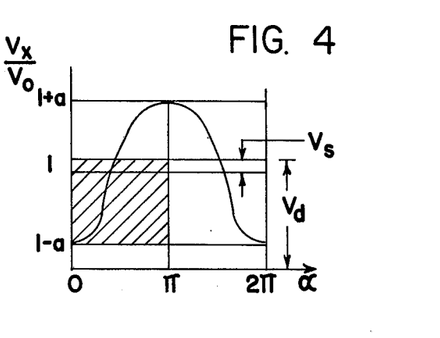
FIG. 4 is a curve used in explaining the operation of a linear detector with two signals.

The characteristic of the linear envelope detector is obtained from the vector diagrams in FIGS. 3 and 4, where $V_o$ presents the sinusoidal noise signal, $V_b = aV_o$ the measurement signal, and the detector input voltage is equal to the sum vector amplitude $V_x = V_o\sqrt{1 + a^2 - 2a\cos\alpha}$. Without signal the detector dc output voltage equals $V_o$; with signal voltage it becomes $$V_D = \frac{V_0}{\pi} \int_0^\pi \sqrt{(1 + a^2 - 2a\cos\alpha)}\, d\alpha . \qquad (4)$$

and, therefore, the rectified dc signal detector output voltage is $$V_S = V_D - V_0 = \qquad (5)$$
$$\frac{V_0}{\pi} \int_0^\pi \sqrt{(1 + a^2 - 2a\cos\alpha)}\, d\alpha - V_0.$$

Equation (5) is plotted in FIG. 5 together with the approximations for high signal levels ($a >> 1$)

$$V_S = aV_o = V_B \qquad (6)$$

and for low signal levels ($a << 1$)

$$V_S = \frac{V_0 a^2}{2}. \qquad (7)$$

Also shown are the corresponding input and output signal-to-noise ratios. The values obtained from (5) using the signal-to-noise scales of FIG. 5 $C_n$ has been approximated by $$C_n = \sqrt{\left(\frac{V_n}{V_0}\right)^2 + 1} - \frac{V_n}{V_n}. \qquad (8)$$

The loop time constant T [equation (3)] is essentially constant at high signal-to-noise ratios, where $C_n \approx 1$ and is independent of signal level. A change in input signal level causes the voltage division A of the attenuator to change but is offset by an almost equal change of the IF amplifier gain $g_1$ due to the AGC action 55 which keeps the IF amplifier 41 output voltage practically constant. For low signal-to-noise ratios at the detector 42 input $C_n$ decreases and the loop time constant increases; i.e., the balancing operation slows down. This corresponds to better filtering of the noise and improvement of the signal-to-noise ratio after the loop filtering; i.e., the loop bandwidth adapts itself to the signal level. There are, however, choices for the tradeoff between speed and noise error. From (1) it follows for the output signal-to-noise voltage ratio $$\frac{V_{4s}}{V_{4n}} = \frac{AV_0}{\frac{AV_n}{C_0}} = \frac{V_0 C_n}{\sqrt{NkT_0 B_{WIF}}} \frac{B_{WIF}}{B_{WL}} \qquad (9)$$

where the closed-loop noise bandwidth is $$B_{WL} = \frac{1}{4T} = \frac{\omega_0 g_1 B C_n}{4A} \qquad (10)$$

where $B_{WIF}$ is the IF noise bandwidth and N is the system noise factor. The rms noise error (NE) becomes $$NE = 20 \log\left(1 + \frac{V_{4s}}{V_{4n}}\right)(dB). \qquad (11)$$

Figure 6:
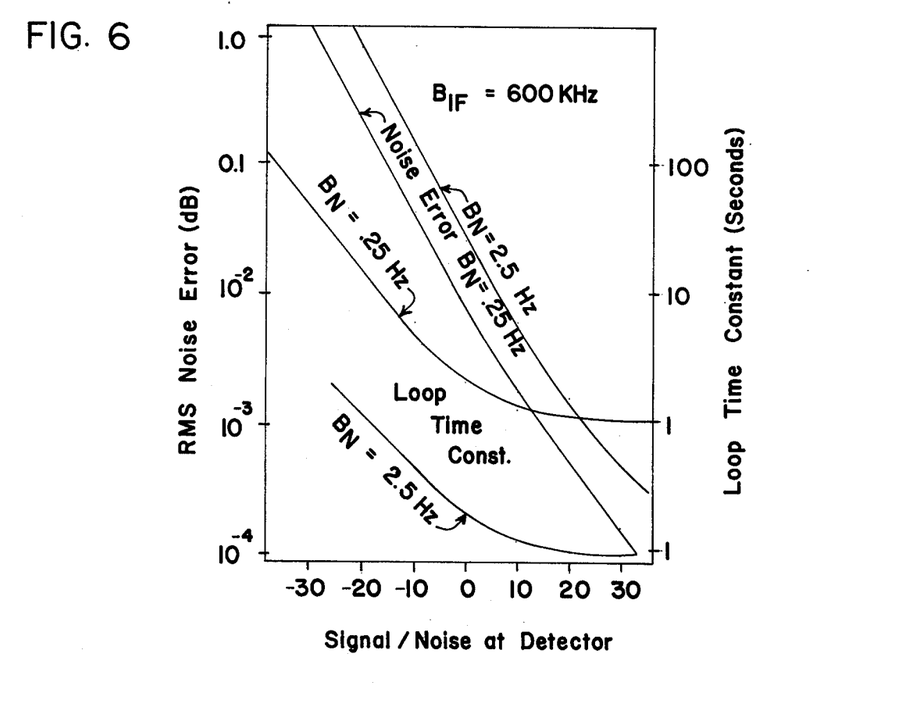
FIG. 6 is a curve that shows the operating characteristics of the closed loop.

Equations (3) and (11) are plotted in FIG. 6 against signal-to-noise ratio at detector 41 for an IF bandwidth of 600 kHz for high signal-to-noise loop-noise bandwidths of 0.25 Hz and 2.5 Hz. In the actual receiver both of these bandwidths are provided as practical solutions and are implemented by a remotely controllable gain change of 20 dB of the loop amplifier gain B. In actual operation there are deviations from data shown due to gain changes of the IF amplifier $g_1$ between the 10-dB step intervals of the attenuator 47 and due to nonlinear operation during balancing following excessively large input level changes, causing temporary overload of the IF post detector signal-processing circuits.

As explained above, the bandwidth is increased when the signal level at line 17 is increased above a given level. This reduces the time required for the closed loop 40–47 to settle to a final value, and, therefore, enables measurements to be made more rapidly. Thus, it is desirable to sense when the closed loop 40–47 has settled, then record the measurement then indicated by readout 60, and then advance the frequencies of oscillators 12 and 13 to the next step. The acts recited in the preceding sentence may be performed either manually or automatically. Whether performed manually or automatically there is a saving in time, if the bandwidth is wide, over the time for the measurement if the bandwidth is narrow. It is impractical to allow a fixed time for settling since this comprises high level signals.

In order to perform a measurement in the shortest possible time, it has to be decided at what point the balancing loop 40–47 has settled to the final value. If operated maually, this decision is made by the operator by waiting for the display 60 to stabilize. At low signal-to-noise ratios an operator typically averages the maximum and minimum excursion of readings.

We will next explain how the method described in the immediately preceding paragraph may be performed automatically. It will be recalled that programmable calculator 62 receives the various variations in the dB values at the output of digital readout 60. The programmable calculator 62 may, therefore, be programmed to sense when the loop 40–47 has settled and act accordingly to then record the measurement as well as change the frequencies of oscillators 12 and 13 to new values. This can be accomplished by software when under calculator control. The time required in a linear single pole system for settling to an error $\epsilon$ from a step of A[dB] is $$\frac{t}{T} = \ln \cdot \frac{1 - 10^{-A/20}}{1 - 10^{\epsilon/20}}. \quad (12)$$

Figure 7:
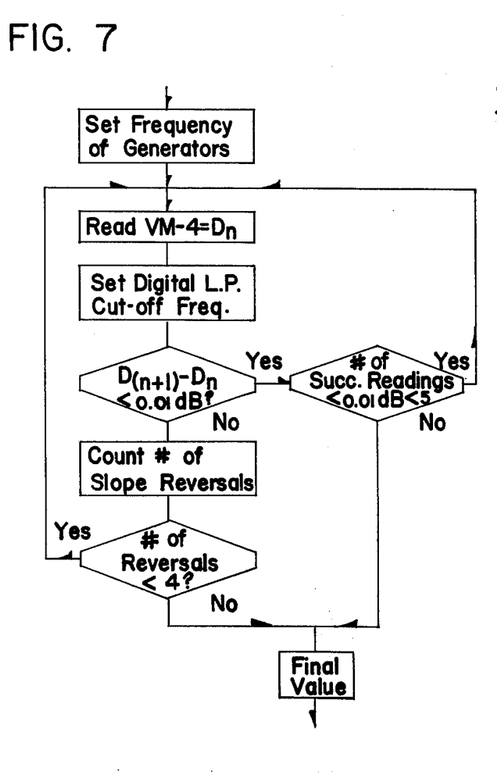
FIG. 7 illustrates the end of measurement decision program for the programmable calculator.

For a level decrease of 100 dB, 22 time constants are required to settle to an error of 0.001 dB. This number, however, is not realistic, because during the first part of the cycle the system is nonlinear due to overload, the adjustment proceeds with loop time constant of 1 s until the reference voltage becomes buried in the noise and the time constant gradually lengthens to 6 s. Also at this level one can expect an rms noise error of about 0.005 dB and, therefore, need not wait any longer until the loop has settled to about this value (16.6 = t/T). Since there is no prior knowledge of step size and direction of final noise level, the measurement time is controlled by calculator software to assure shortest measurement time. Readings are taken during the adjustment process and compared with each other until the values have settled to a fixed number — in the case of high signal-to-noise ratio — or until the readings indicate that changes are due to noise only — for low signal-to-noise ratios. FIG. 7 shows the implementation of the program. Digital data taken is low-pass filtered by using an algorithm of the form $$K2 + (K8 - K2) \times K5 = K2 \quad (13)$$

where K2 is the output value from previously performed filtering, K8 is the new measurement value and K5 is the cutoff frequency factor of filter.

For K5 = 1 the output K2 equals the input K8, while for K5 < 1 low-pass filter action is obtained. K5 is set according to the measurement value and is between 0.5 and 0.003. Data output of the low-pass filter is set first to determine whether succeeding values are within 0.01 dB of each other. If this condition is obtained five times in a row, the measurement is terminated and the results stored in the programmable calculator 62 for later use. This case corresponds to the high signal-to-noise ratio case.

If successive values have a difference greater than 0.01 dB, the direction of data slope is determined first and slope reversals are observed. Those reversals will occur when the loop has settled and changes due to noise become dominant. The number of slope reversals are counted and the measurement is terminated after the fifth reversal and the output data is taken as the average between the values at the fourth and fifth slope reversal. The results are then stored in program calculator 62 for future use.

Since step attenuators, such as 47 and 48, change their attenuations abruptly, and employ mechanical switches for making changes, they have a substantially different effect on the closed loop than continuously variable attenuators such as 46. The abrupt changes in the step attenuators create more disturbances in the closed loop than continuously variable attenuators would, and the step attenuators are slower in acting due to mechanical switching. Therefore, there is the need for monitoring the circuit to see when it settles to a stable state and to undertake efforts to speed up the operations due to delays resulting from switching step attenuators.

To calibrate an attenuator at various frequencies between 1 and 18 GHz, with the above apparatus, one proceeds as follows. Without inserting the attenuator to be calibrated, that is, leaving out the "device under test" 10 to create a closed insertion point, the apparatus is operated at the various selected frequencies between 1 and 18 GHz and the output of readout 60 stored in programmable calculator 62 for each frequency. The attenuator to be calibrated is then inserted into the circuit and constitutes the "device under test" 10. The apparatus is then again operated at the same various selected frequencies and the output of readout 60 stored in the programmable calculator 62 for each frequency. Thereafter, for each one of the various selected frequencies, the programmable calculator 62 subtracts the results of the two readings (one such reading being with the attenuator under test being inserted at 10, and the other being without the attenuator under test inserted), and records the results. The programmable calculator 62 may then instruct the X-Y recorder to plot the results, which, as stated above, show the dB values for the attenuator under test 10 in relation to frequency over the range from 1 to 18 GHz.

SUMMARY

From the foregoing it is clear that I have provided a closed loop IF-parallel substitution system of great dynamic range and high accuracy with variable closed loop bandwidth in which the closed loop bandwidth is a function of the signal level and where said bandwith is responsible for reduction of inherent thermal noise for the purpose of achieving lower noise errors automatically.

The means by which this can be achieved are:

(1) Configuration of the circuit 40 to 47 as a first order loop, containing one integrator 45 as a frequency determining control element only, causing a closed loop bandwith which is directly depending on the open loop gain.

(2) The open loop gain (and hence the closed loop bandwidth) is changed by the 10 dB/step attenuator, the gain of the AGC controlled IF amplifier and the signal suppression by the noise in the IF detector and an additional loop amplifier.

(3) At high signal-to-noise levels the open loop is essentially independent of the signal level because the gain change of the AGC amplifier and the gain change due to attenuators 46, 47 and 48 substantially cancel each other.

(4) At low signal-to-noise levels this cancellation does not exist any more because the AGC amplifier gain is held constant by noise.

(5) In addition the signal suppression by noise in the detector provides open loop gain change.

Both factors 4 and 5 reduce the closed loop bandwidth at decreasing levels and provide for noise filtering.

(6) High measurement accuracy is provided by the IF-parallel substitution principle whereby the substitution signal is generated by an automatically adjusted precision step attenuator 47 and an analog closed loop controlled signal $V_4$ of limited level range at the frequency of the IF-input signal.

(7) The most significant digits of the measurement results (in multiples of 10 dB) are obtained by the value of the step attenuator 47.

(8) The lesser significant digits are obtained by measurement means for signal $V_4$ consisting of automatically adjusted step attenuator 48, linear detector 49, analog shaper 50 and A/D converter 51, providing the advantage that adjustments in this branch do not disturb the closed loop equilibrium and settling.

(9) Errors in the individual steps of the precision attenuators 47 and 48 are beforehand determined and their negative values stored in a programmable read-only-memory 54 and these are added together with the values from attenuators 47 and 48 and A/D converter 51 in adder 53 to become the readout value 60.

I claim to have invented:

1. A device for generating a second signal of approximately the same frequency and equal amplitude as a first signal comprising:
   first signal producing means for producing a first signal,
   second signal producing means for producing a second signal, said last-named means having an output,
   attenuator means having an input connected to said output,
   closed loop means, including said attenuator means, and having a bandwidth as well as noise, said attenuator means feeding its output into said closed loop,
   said closed loop means including means for receiving said first signal and also including comparison means for comparing the amplitudes of said two signals received by it, and for selecting an attenuation of said attenuator means based on said comparison, to provide a bandwidth when the first signal has relatively low signal strength narrow enough to filter out a substantial part of the noise and thus improve the signal-to-noise ratio, and to provide a wider bandwidth when the first signal has relatively strong signal strength to improve the speed at which the closed loop means settles to a final condition after a change in the attenuation of said attenuator means.

2. A device as defined in claim 1 in which said comparison means includes an integrator which integrates the two signals to compare the signals, and controls said attenuator means according to said comparison.

3. A device as defined in claim 2 in which said closed loop means includes an amplifier having an input for receiving both the output of said attenuator means, and said first signal.

4. A device as defined in claim 3 in which said integrator controls said attenuator means to tend to hold the amplitude of the second signal equal to the amplitude of the first signal, at the input of said amplifier.

5. A device as defined in claim 1 in which said attenuator means comprises two sections one of which is a step attenuator and the other of which is a variable attenuator, said comparison controlling said variable attenuator.

6. A device as defined in claim 2 in which said attenuator means comprises two sections one of which is a step attenuator and the other of which is a variable attenuator, said integrator controlling said variable attenuator.

7. A device as defined in claim 5 including
   an attenuating path, connected at one end at the output of said variable attenuator,
   said path including attenuating means for changing the attenuation in said path according to changes in the level at the output of said variable attenuator,
   means responsive to predetermined changes in the value of the attenuation in said path for stepping said step attenuator,
   a second step attenuator,
   a linear detector, a sharper and an A/D converter, responsive to changes in the attenuation of said second step attenuator as well as the absolute value of the amplitude of said first signal, and
   an adder responsive to the attenuation values of said second step attenuator and said step attenuator in said closed loop and said A/D converter and to predetermined errors in the steps of said step attenuators, and a digital readout.

8. A device as defined in claim 6 in which said attenuator means comprises two sections one of which is a step attenuator and the other of which is a variable attenuator, said comparison means controlling said variable attenuator.

9. A device as defined in claim 1 including step attenuating means outside the closed loop for varying the attenuation of said second signal whereby to have no closed loop disturbances resulting from step changes of the attenuator which otherwise would be the case if the last-named step attenuator were in the loop.

10. The method of testing the accuracy of an attenuator under test at a series of different frequencies comprising:
    producing signals at one of said series of different frequencies,
    passing said signals through said attenuator to produce attenuator output signals,
    mixing said attenuator output signals with local oscillator signals to produce intermediate frequency signals of constant frequency irrespective of the frequency of the first-named signals,
    producing a comparison signal,
    comparing the intermediate frequency signal and the comparison signal in a closed loop and varying the level of the comparison signals to be equal to the said intermediate signal,
    narrowing the bandwidth of the closed loop at low signal levels of said intermediate frequency signal to improve the signal-to-noise ratio and widening the bandwidth of the closed loop at high signal levels to shorten the time required for the closed loop to settle to a steady state, determining when the closed loop has settled to a steady state, thereafter determining the level of the comparison signal by making measurements of the comparison signal controlled by the closed loop, and then proceeding with a test with said first-named signals at another freuency of said series.

11. The method of claim 10 in which the same method is performed without said attenuator under test, and subtracting the results of the measurements with and without the attenuator under test inserted to determine the attenuation values of the attenuator under test at different frequencies.

12. Apparatus for automatically substituting the amplitude of an I.F. signal comprising:

a signal source for producing said substitution at said I.F. frequency signal, closed loop means, including attenuator means for receiving the output of said substitution signal source and for controlling the amplitude of said substitution signal, a branch attenuating system connected to said closed loop and for measuring the amplitude of said substitution signal at one point in said closed loop, said branch attenuating system including control means for controlling the attenuation of at least a part of said attenuator means.

13. Apparatus as defined in claim 12 in which said branch attenuating system includes a linear detector.

14. Apparatus as defined in claim 12 in which said branch attenuative system includes an analog shaper for conversion of linear voltage to dB proportionality.

15. Apparatus as defined in claim 12 in which said branch attenuating system includes an analog to digital converter.

16. Apparatus as defined in claim 12 in which said branch attenuating system comprises a linear detector and an analog to digital converter.

17. Apparatus as defined in claim 12 in which said branch attenuating system comprises a step attenuator, a linear detector and an analog to digital converter.

18. Apparatus as defined in claim 12 in which said branch attenuating system comprises a step attenuator, a linear detector and an analog to digital converter, and an analog shaper.

19. Apparatus as defined in claim 17 in which said analog to digital converter controls said control means which steps said step attenuator as well as controls the attenuation of at least a part of said attenuator means.

20. Apparatus as defined in claim 12 in which said branch attenuating system includes an analog shaper for conversion of linear voltage to dB proportionality.

21. Apparatus as defined in claim 12 in which said branch attenuating system comprises a step attenuator, a linear detector and an analog to digital converter and an analog shaper.

22. Apparatus for automatically substituting the amplitude of an I.F. signal comprising:

a signal source for producing said substitution at said I.F. for signal, closed loop means, including attenuator means for receiving the output of said substitution signal source and for controlling the amplitude of said substitution signal, a branch attenuating system connected to said closed loop and for measuring the amplitude of said substitution signal at one point in said closed loop, and adder means for adding the measured amplitude level of said branch and of at least a part of said attenuator means.

23. Apparatus as defined in claim 22 in which said branch attenuating system includes a linear detector.

24. Apparatus as defined in claim 22 in which said branch attenuating system includes an analog to digital converter.

25. Apparatus as defined in claim 22 in which said branch attenuating system comprises a linear detector and an analog to digital converter.

26. Apparatus as defined in claim 22 in which said branch attenuating system comprises a step attenuator, a linear detector and an analog to digital converter.

* * * * *